US009496114B2

(12) United States Patent
Champeaux et al.

(10) Patent No.: US 9,496,114 B2
(45) Date of Patent: Nov. 15, 2016

(54) MICROWAVE GENERATOR WITH VIRTUAL CATHODE OSCILLATOR AND OPEN REFLECTORS

(71) Applicant: Commissariat A L'Energie Atomique et Aux Energies Alternatives, Paris (FR)

(72) Inventors: Stephanie Champeaux, Breuillet (FR); Philippe Gouard, Yerres (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 14/652,987

(22) PCT Filed: Dec. 19, 2013

(86) PCT No.: PCT/FR2013/053204
§ 371 (c)(1),
(2) Date: Aug. 11, 2015

(87) PCT Pub. No.: WO2014/096728
PCT Pub. Date: Jun. 26, 2014

(65) Prior Publication Data

US 2015/0348736 A1 Dec. 3, 2015

(30) Foreign Application Priority Data

Dec. 20, 2012 (FR) ..................................... 12 62385

(51) Int. Cl.

| | |
|---|---|
| ***H01J 25/02*** | (2006.01) |
| ***H01P 1/16*** | (2006.01) |
| ***H01P 1/20*** | (2006.01) |
| ***H03B 9/01*** | (2006.01) |
| ***H01J 25/32*** | (2006.01) |
| ***H01J 25/74*** | (2006.01) |

(52) U.S. Cl.
CPC ................ *H01J 25/32* (2013.01); *H01J 25/02* (2013.01); *H01J 25/74* (2013.01); *H01P 1/20* (2013.01)

(58) Field of Classification Search
None
See application file for complete search history.

(56) References Cited

U.S. PATENT DOCUMENTS

2011/0084606 A1* 4/2011 Olsson .................... H01J 25/02 315/39.53

FOREIGN PATENT DOCUMENTS

| | | | |
|---|---|---|---|
| FR | 2876218 | A1 | 4/2006 |
| WO | WO 2009/136832 | A1 | 11/2009 |

OTHER PUBLICATIONS

Mankowski, J.J. et al. "Experimental results of a 2GW vircatar", ICOPS 2003. IEEE Conference Record—Abstracts. The 30th IEEE International Conference on Plasma Science, Jeju, Korea, Jun. 205, 2003; [IEEE International Conference on Plasma Science], New York, NY: IEEE, US, vol. Conf. 30, Jun. 2, 2003, p. 187.

*Primary Examiner* — Dedei K Hammond
(74) *Attorney, Agent, or Firm* — Brinks Gilson & Lione

(57) ABSTRACT

A device for generating microwaves with an oscillating virtual cathode includes a cathode, and a thin anode positioned at an inlet of a cylindrical waveguide (5). The waveguide includes at least one first open reflector and one last open reflector that are transparent to electrons and capable of reflecting a microwave created by at least one virtual cathode generated in the waveguide. A plurality of open reflectors are between the first and last open reflector, such that a designated reflector of the plurality of open reflectors has a radius R(i−1) less than or equal to a radius Ri of an immediately preceding reflector and the last open reflector has a radius RN less than a radius R1 of the first open reflector.

9 Claims, 3 Drawing Sheets

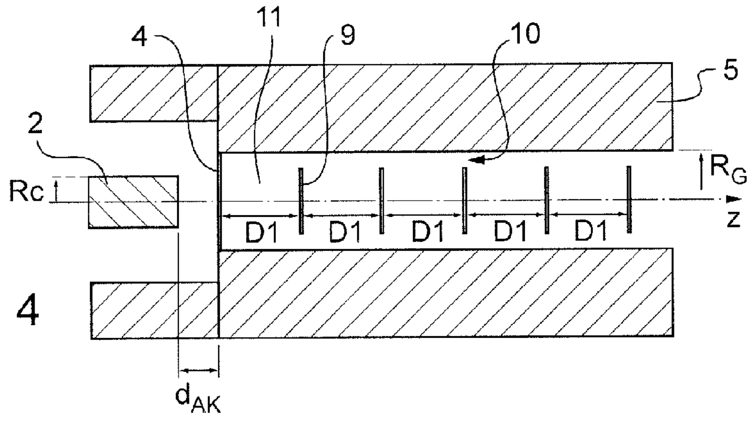

Fig. 4

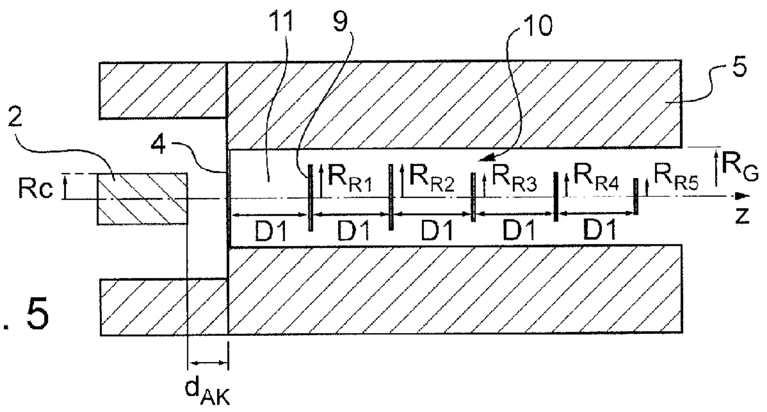

Fig. 5

| Axial vircator with "open" reflectors of uniform radius | | | | | | | | | | |
|---|---|---|---|---|---|---|---|---|---|---|
| Reflectors | #1 | | #2 | | #3 | | #4 | | #5* | |
| number | Position [mm] | Radius [mm] | Position [mm] | Radius [mm] | Position [mm] | Radius [mm] | Position [mm] | Radius [mm] | Position [mm] | Radius [mm] |
| 1 | 60 | 60 | | | | | | | | |
| 2 | 60 | 60 | 120 | 60 | | | | | | |
| 3 | 60 | 60 | 120 | 60 | 180 | 60 | | | | |
| 4 | 60 | 60 | 120 | 60 | 180 | 60 | 240 | 60 | | |
| 5 | 60 | 60 | 120 | 60 | 180 | 60 | 240 | 60 | 300 | 60 |

*anode - reflector distance

Fig. 6

| Axial vircator with "open" reflectors of decreasing radius | | | | | | | | | | |
|---|---|---|---|---|---|---|---|---|---|---|
| Reflectors | #1 | | #2 | | #3 | | #4 | | #5 | |
| number | Position [mm] | Radius [mm] | Position [mm] | Radius [mm] | Position [mm] | Radius [mm] | Position [mm] | Radius [mm] | Position [mm] | Radius [mm] |
| 1 | 60 | 60 | | | | | | | | |
| 2 | 60 | 60 | 120 | 60 | | | | | | |
| 3 | 60 | 60 | 120 | 60 | 180 | 50 | | | | |
| 4 | 60 | 60 | 120 | 60 | 180 | 50 | 240 | 50 | | |
| 5 | 60 | 60 | 120 | 60 | 180 | 50 | 240 | 50 | 300 | 40 |

*anode - reflector distance

Fig. 7

MICROWAVE GENERATOR WITH VIRTUAL CATHODE OSCILLATOR AND OPEN REFLECTORS

This application is a U.S. nationalization of PCT Appl. No. PCT/FR2013/053204, filed Dec. 19, 2013 and published as PCT publication No. WO 2014/096728 on Jun. 26, 2014, the disclosure of which is hereby incorporated by reference.

TECHNICAL FIELD

The present invention concerns a microwave wave generator device with a virtual cathode oscillator (i.e. of VIRCATOR type, VIRCATOR standing for "VIRtual CAthode oscillaTOR")

BACKGROUND

A microwave wave generator device with a virtual cathode oscillator conventionally comprises a diode constituted by a cathode and an anode, emitting a beam of electrons, as well as a cylindrical wave guide. The anode is generally constituted by a thick frame and by a thin sheet (frequently called "thin anode" below by simplification). By "thin" it is meant here that the sheet of the anode has a thickness of a few tenths of micrometers. As regards the thin sheet, it is coupled to the cylindrical wave guide. In other words, the thin anode separates the cathode from the wave guide, at the interface between the thick frame and the wave guide, and, furthermore, the thick armature generally surrounds the cathode.

This type of device is known to produce high power pulses of microwaves

To that end, a potential difference is applied to the terminals of the diode creating an electronic emission at the location of the cathode. At the location of the thin sheet of the anode, the components of the electric field that are transverse relative to a longitudinal axis of the wave guide cancel out, the electron beam begins to be pinched under the effect of its magnetic field. When the current entering the cylindrical wave guide exceeds the space-charge current limit, the electron density becomes so great that the beam can no longer propagate within the wave guide. An accumulation of charge, commonly called "virtual cathode", then forms behind the thin sheet. The virtual cathode then deviates numerous electrons to the extent of sending some back towards the cathode, through the thin sheet. While approaching the thin anode, the virtual cathode increases its charge density until the time at which it disintegrates under the effect of its own space-charge and a new virtual cathode reconstitutes a little further in the wave guide. This is the oscillation principle of the virtual cathode which is at the origin of a microwave wave emission.

Such a device is compact and of simple design. Its operation is robust and does not require recourse to an external magnetic field. However its power efficiency (ratio of maximum power of the emitted wave to the maximum electrical power input into the diode) is very low, of the order of 1%. Furthermore, the frequencies of the emitted wave directly follow the temporal variations in the applied voltage, which leads to an electromagnetic wave being obtained of mediocre spectral quality.

To counter at least some of these drawbacks while maintaining an axial geometry, the implantation of one or more reflectors in the cylindrical wave guide has been proposed. This type of device was the subject of patent application WO2006037918.

The reflectors are thin walls (that is to say a few tenths of micrometers thick), transparent to electrons and configured to reflect the microwave wave created by the virtual cathodes. Furthermore, generally they are of circular cylindrical shape.

This type of device with reflectors enables substantially improved performance to be obtained relative to the devices without reflector. However, there is an optimum number of reflectors beyond which the power efficiency decreases.

SUMMARY

The present invention aims to increase the efficiency of the microwave tubes of axial VIRCATOR type with reflectors.

To that end, a microwave wave generator device with a virtual cathode oscillator is provided, comprising a cathode, and a thin anode positioned at an entrance to a cylindrical wave guide of radius $R_G$, the thin anode being situated between the cathode and the wave guide, characterized in that the device comprises at least a first open reflector and a last open reflector which are located in the wave guide, and transparent to electrons and configured to reflect a microwave wave created by at least one virtual cathode generated in the wave guide, the first open reflector being the closest reflector to the thin anode, and the last open reflector being the closest reflector to an exit from the wave guide, and the last open reflector having a radius $R_{RN}$ less than a radius $R_{R1}$ of the first reflector.

According to an advantageous aspect, there is also provided a microwave wave generator device with a virtual cathode oscillator, in axial configuration, comprising a cathode, and a thin anode positioned at an entrance to a cylindrical wave guide of radius $R_G$, the thin anode being situated between the cathode and the wave guide, the device further comprising at least a first open reflector and a last open reflector which are located in the wave guide, and transparent to electrons and configured to reflect a microwave wave created by at least one virtual cathode generated in the wave guide, the first open reflector being the closest reflector to the thin anode, and the last open reflector being the closest reflector to an exit from the wave guide, the device being characterized in that it comprises a plurality of open reflectors, among which are the first and the last open reflector such that a reflector of the plurality has a radius $R_{R(i+1)}$ less than or equal to a radius $R_{Ri}$ of a directly preceding reflector of the plurality and in that the last open reflector has a radius $R_{RN}$ less than a radius $R_{R1}$ of the first open reflector.

A reflector is referred to herein as "open" when it obstructs only a centered fraction of cross-section of the cylindrical wave guide, leaving a substantially annular opening between a periphery of the reflector and an inside wall of the wave guide.

Such a device makes it possible not only to increase the efficiency of a conventional axial VIRCATOR, but also to increase the efficiency of an axial VIRCATOR with reflectors.

The introduction of open reflectors makes it possible to facilitate the flow of the wave, emitted by the different virtual cathodes, towards the exit of the guide.

In some embodiments of the invention, the first open reflector is advantageously situated at a distance D1 from the thin anode equivalent to twice a distance $d_{Ak}$ separating the cathode from the thin anode. In this way, the first virtual cathode is created and positioned approximately half way between the thin anode and the first reflector. Moreover, two consecutive open reflectors present between them a distance equal to the distance D1 separating the thin anode from the cathode.

According to a favored embodiment, the radius $R_{R1}$ of the first open reflector is equal to or greater than 0.75 $R_G$.

This enables a maximum of the radial component of the electric field of the wave to be reflected and to strengthen the wave emitted by the first virtual cathode then situated in a first pseudo-cavity delimited by the thin anode, the inside wall of the wave guide, and the first reflector.

According to an example embodiment, a radius $R_{R2}$ of at least one second open reflector, situated between the first open reflector and the last open reflector, is less than or equal to the radius $R_{R1}$ of the first open reflector and greater than the radius $R_{RN}$ of the last open reflector.

According to another example embodiment, a radius $R_{R2}$ of at least one second open reflector, situated between the first open reflector and the last open reflector, is less than the radius $R_{R1}$ of the first open reflector and greater than or equal to the radius $R_{RN}$ of the last open reflector.

A reduction in the radius of the successive reflectors enables the electrons to be positioned in the neighborhood of a longitudinal axis z of the wave guide preventing them from interacting with the microwave wave in the regions where the latter has maximum electromagnetic field amplitudes. The average position of the virtual cathode formed beyond a reflector of rank (i+1) is thus away from the zone in which the amplitude of the wave is high.

According to an advantageous embodiment, at least the radius $R_{RN}$ of the last reflector is less than 0.75 $R_G$, and possibly even the radius $R_{RN}$ of the last reflector is less than 0.5 $R_G$.

According to a particular example, the radius $R_{R2}$ of a second reflector is less than 0.75 $R_G$, and possibly the radius $R_{R2}$ of the second reflector is less than 0.5 $R_G$.

For example, the radius $R_{Ri}$ of a reflector of the plurality, which ever it be, as of a second reflector (that is to say for i greater than or equal to 2, i.e. i comprised between 2 and N) is less than 0.75 $R_G$, and possibly the radius $R_{Ri}$ of the reflector is less than 0.5 $R_G$. Optionally, the radius $R_{Ri}$ however is still greater than the radius $R_{RN}$ of the last reflector.

The radius $R_{Ri}$ of the reflectors is progressively reduced from the first to the last, without lower limit, which increases the performance of the device.

According to another example embodiment, the device comprises, between the first and the last open reflector, a plurality of open reflectors, such that a reflector of the plurality of rank (i+1) presents a radius $R_{R(i+1)}$ less than or equal to the radius $R_{Ri}$ of a reflector of the plurality of directly preceding rank (i).

According to a favored example, a reflector of the plurality of rank (i) presents a radius $R_{Ri}$ greater than the radius $R_{Rj}$ of a reflector of the plurality of rank (j>i).

Possibly even, according to another particular example, the radius $R_{R(i+1)}$ of the reflector of the plurality of rank (i+1) is less than the radius $R_{Ri}$ of the reflector of the plurality of directly preceding rank (i), and the radius $R_{R(i+1)}$ of the reflector of the plurality of rank (i+1) is also possibly greater than the radius $R_{RN}$ of the last reflector and the radius $R_{Ri}$ of the reflector of the plurality of rank (i) is less than the radius $R_{R1}$ of the first reflector.

Thus, the reflectors may decrease in stages, or else decrease linearly or exponentially from the first to the last for example.

For example, a device according to the invention comprises reflectors of equal radii by groups, for example two by two or three by three, or more. For example, the first reflector and the second reflector have identical radii, then the third reflector and the fourth reflector have identical radii, and so forth, with for example the radius of the third and fourth reflector less than that of the first and second reflector.

According to another example, all the reflectors present in the wave guide have the same radius, except for the last reflector which has a smaller radius.

According to still another example, the first reflector and the second reflector have a radius greater than 0.75 $R_G$. And for example the radius of the last reflector is equal to or less than 0.5 $R_G$.

The radii of the reflectors comprised between the first reflector and the last reflector are for example equal to or less than the radius of the first reflector, or even equal to or less than 0.75 $R_G$, and/or equal to or greater than the radius of the last reflector, or even equal to or greater than 0.5 $R_G$. The radii of the reflectors comprised between the first reflector and the last reflector are possibly both equal to each other, or they decrease such that the radius of one reflector is equal to or less than that of the preceding one.

According to an advantageous example embodiment, the radii of the reflectors of the plurality of reflectors, among which are the first and the last reflector, decrease with a constant step size p. For example, the first and the second reflector have the same radius of value $R_{R1}$, the third reflector has for example a smaller radius $R_{R3}$, of value for example $R_R-p$. A fourth reflector has for example a smaller radius than the third of value for example $R_{R3}-p$, and so forth. In other words, if a reflector has a radius less than the directly preceding reflector, it is reduced by a step size p.

The step size p represents for example an absolute value, for example at each reduction, the radius of a reflector is reduced by 10 mm, or by 5 mm; or a relative value, for example at each reduction, the radius of a reflector is reduced by 10% relative to the radius of the directly preceding reflector, or 5%.

Whereas a device with reflectors according to the prior art presents an optimum number of reflectors beyond which the power efficiency decreases, in a device as described above, the efficiency increases with the number of reflectors of decreasing radius that are positioned in the wave guide.

According to a favored embodiment, the plurality of open reflectors comprises at least three open reflectors, that is to say that the device comprises at least three open reflectors positioned in the wave guide. It comprises for example between three and six reflectors.

The plurality of reflectors thus presents at least two different sizes of radius, that of the first reflector $R_{R1}$, that of the last reflector $R_{RN}$ which is less than $R_{R1}$, and the radius of the reflectors situated between the first and the last reflector which would for example all be equal to the first or all equal to the last. At maximum, the plurality of reflectors presents the same number of different radii as there are reflectors.

Thus for example, a second reflector, positioned between the first reflector and the last reflector, presents a radius $R_{R2}$ which is: either equal to the radius $R_{R1}$ of the first reflector, or comprised between the radius $R_{R1}$ of the first reflector and the radius $R_{RN}$ of the last reflector, or equal to the radius $R_{RN}$ of the last reflector. The same logic applies for a greater number of reflectors.

Moreover, it is advantageous for at least one open reflector, which is not only transparent to electrons and configured to reflect a microwave wave, to be formed, moreover, from aluminized mylar, or even for all the reflectors to be formed from aluminized mylar.

A microwave wave generator device with a virtual cathode oscillator of the prior art commonly called Vircator ("VIRtual CAthode oscillaTOR") is represented in FIG. 1.

The Vircator comprises a diode 2, 3, 4 constituted by a cathode 2 and by an anode 3, 4, emitting a beam of electrons 1, as well as by a cylindrical wave guide 5. The anode 3, 4 is constituted by a thick frame 3 and by a thin sheet 4 (frequently called "thin anode 4" below by simplification). By "thin" it is meant here that the sheet of the anode has a thickness of a few tenths of micrometers. As regards the thin sheet 4, it is coupled to the cylindrical wave guide 5. In other words, the thin anode 4 separates the cathode 2 from the wave guide 5 by being situated at an entrance to the wave guide 5, at an interface between the thick frame 3 and the wave guide 5; and the thick frame 3 surrounds the cathode 2.

This type of device is known to produce high power pulses of microwaves

To that end, a potential difference is applied to the terminals of the diode 2, 3, 4 creating an electronic emission at the location of the cathode 2. When the density of electron current emitted exceeds the Child-Langmuir current density limit, the electron beam 1 disintegrates under the effect of its own space charge. At the location of the thin sheet 4 of the anode, the components of the electric field that are transverse relative to an axis z cancel each other, the electron beam 1 begins to be pinched under the effect of its magnetic field. When the current entering the cylindrical wave guide 5 exceeds the space-charge current limit, the electron density becomes so great that the beam can no longer propagate within the wave guide 5. An accumulation of charge 6, commonly called "virtual cathode 6", then forms behind the thin sheet 4. The virtual cathode 6 then deviates numerous electrons to the extent of sending some back towards the cathode 2, through the thin sheet 4.

While approaching the thin anode 4, the virtual cathode 6 increases its charge density until the time at which it disintegrates under the effect of its own space charge and a new virtual cathode reconstitutes a little further in the wave guide 5. This is the oscillation principle of the virtual cathode which is at the origin of an emission of a microwave wave 7.

The virtual cathode 6 moves around an average position which is situated at a distance from the thin anode 4 approximately equal to that separating the thin anode 4 from the emitter cathode (that distance being designated by $d_{Ak}$). The electrons which are sent back by the virtual cathode 6 towards the cathode 2 passing through the thin anode 4 are modulated to the frequency of the microwave wave and interact with the electron beam 1 created in the space between the cathode 2 and the thin anode 4 while modulating it slightly. These backscattered electrons are braked between the thin anode 4 and the cathode 2. They are also mainly deviated towards the frame of the anode 3.

The electrons which cross the virtual cathode 6 take back energy from the microwave wave which propagates in the guide, so reducing its intensity.

The dimensioning of an axial Vircator according to the known state of the art is the following:

The frequency f of the emitted wave (expressed in GHz) is a function of the distance $d_{Ak}$ (expressed in cm) that separates the cathode 2 from the thin anode 4 and the relativistic factor γ of the electrons at the location of the thin anode 4 in relation with the potential difference applied to the diode 2, 3, 4. This frequency may be estimated by the following formula:

$$f = \frac{4.77}{d_{AK}} \log\left(y + \sqrt{y^2 - 1}\right)$$

With $$y = 1 + {}^{eV}/mc^2,$$

where e is the charge of an electron, V the potential difference applied between the electrodes of the diode 2, 3, 4, m is the mass of an electron and c is the speed of light.

The wave having axial rotational symmetry progresses in modes referred to as "transverse magnetic", designated by "$TM_{0n}$", the axial component of its magnetic field being nil. In order for it to propagate inside the cylindrical guide 5 only in mode $TM_{01}$, the radius $R_G$ of the wave guide 5 must be greater than the cut-off wavelength of the following mode $TM_{02}$. The equation below (and not the inverse formula which turned out to be erroneous) takes account of these propagation conditions:

$$\frac{k_{01} c}{2\pi f} \le R_G \le \frac{k_{02} c}{2\pi f}$$

where $k_{0n}$ represents the root of the equation of the Bessel function $J_0(k_{0n})=0$, with $k_{01}=2{,}4048$ and $k_{02}=5{,}5201$.

The length of the wave guide 5 must, preferably, be equal to several times the wavelength λ of the electromagnetic wave 7 (λ=c/f).

The best operation for coupling the virtual cathode 6 with the electromagnetic wave 7 is obtained when the maximum density of the virtual cathode 6 at its average position is situated in the neighborhood of the maximum of the radial component of the electric field of the electromagnetic wave. Considering that the electromagnetic wave propagates in the $TM_{01}$ mode alone and considering also the disintegration of the beam on emission, the radius $R_c$ of the cathode 2 must then, preferably, verify the following relationship:

$$R_c < 1.8412 \frac{R_G}{k_{01}} \approx 0.75 \times R_G$$

The device described above is compact and of simple design. Its operation is robust and does not require recourse to an external magnetic field. However its power efficiency (ratio of maximum power of the emitted wave to the maximum electrical power input into the diode) is very low, of the order of 1%. Furthermore, the frequencies of the emitted wave directly follow the temporal variations in the applied voltage, which leads to an electromagnetic wave being obtained of mediocre spectral quality.

To counter at least some of these drawbacks while maintaining an axial geometry, the implantation of one or more reflectors in the cylindrical guide 5 has been proposed.

The reflectors may be "closed" or "open". As illustrated in FIG. 3, a reflector is said to be "closed" when it entirely closes a cross-section of the guide (this is the case, for example, for the first reflector 8 of FIG. 2), and a reflector is said to be "open" when it only obstructs a centered fraction of cross-section of the guide, leaving a substantially annular opening 10 between the periphery of the reflector and the inside wall of the wave guide 5 (this is the case, for example, for the reflector 9 of FIG. 2).

The reflector furthest away from the thin anode 4 is preferably open in order to enable the microwave wave to propagate towards the exit from the wave guide 5, the exit being the opposite end of the wave guide 5 from that where the thin anode 4 is situated.

Conventionally, an open reflector presents a radius $R_R$ greater than or equal to 0.75 time the radius $R_G$ of the circular wave guide 5 to reflect the maximum of the radial component of the electric field of the wave.

The first reflector is positioned within the wave guide 5 at a distance D1 from the thin anode 4. This distance D1 is equal to substantially twice the distance $d_{Ak}$ that separates the thin anode 4 from the cathode 2, such that the virtual cathode is created and positioned approximately at mid-distance between the thin anode 4 and the first reflector. The following reflectors are positioned in the wave guide beyond the first reflector, such that the same distance D1 separates two consecutive reflectors, D1 being equal to substantially twice the distance $d_{Ak}$ that separates the thin anode 4 from the cathode 2.

The first reflector is operative to reflect, like the thin anode 4, the wave emitted by the virtual cathode. The reflected wave again interacts with the electrons and the virtual cathode, amplifying the microwave wave. A cylindrical pseudo-cavity 11, formed between the thin anode 4, the first reflector and an inside wall of the wave guide 5 enables the power of the wave created by the virtual cathode to be strengthened. This strengthening of the wave contributes to strengthening the bunching of the electrons of the virtual cathode at the desired frequency.

By introducing a plurality of reflectors into the device, the mechanism for strengthening the microwave wave and for bunching which takes place in the first pseudo-cavity 11 is duplicated in the following pseudo-cavities 11 formed by two successive reflectors (for example 8 and 9 in FIG. 2) and the wave guide 5.

Thus the electrons which cross the reflector of rank (i) ($1 \leq i \leq N-1$, where N is the total number of reflectors present) create an $(i+1)^{th}$ virtual cathode of which the oscillation frequency is determined by the pseudo-cavity 11 formed by the reflectors of rank (i) and (i+1) and the inside wall of the wave guide 5. This pseudo-cavity contributes to strengthening the electromagnetic wave emitted by the $(i+1)^{th}$ virtual cathode and the bunching of the electrons.

If the reflector (i+1) is open, the electromagnetic wave emitted by the $(i+1)^{th}$ virtual cathode can flow inside the guide 5 beyond the reflector (i+1), towards the neighboring pseudo-cavity, via the annular opening 10 present between the periphery of the reflector (i+1) and the inside wall of the wave guide 5.

This type of device with reflectors enables substantially improved performance to be obtained relative to the devices of the prior art without reflector.

A device with a single reflector exhibits an improvement in efficiency of the order of 4%. The addition of a second open reflector leads to an improvement of the order of 6%.

However, for such a device comprising reflectors, there is an optimum number of reflectors beyond which the power efficiency decreases.

A microwave wave generator device with a virtual cathode oscillator according to an example embodiment of the prior art is for example represented in FIG. 2. In this example, two reflectors 8, 9, which are transparent to electrons and configured to reflect the microwave wave created by the virtual cathodes (not shown in FIG. 2 in the interest of simplification), are positioned in the cylindrical wave guide 5. The reflectors are thin, that is to say a few tenths of micrometers thick, and are of circular cylindrical shape.

The first reflector 8 is closed and positioned within the wave guide 5 at a distance D1 from the thin anode 4. This distance D1 is equal to substantially twice the distance $d_{Ak}$ that separates the thin anode 4 from the cathode 2, such that the virtual cathode is created and positioned approximately at mid-distance between the thin anode 4 and the reflector 8.

A second reflector 9, which is open, is positioned in the wave guide beyond the first closed reflector 8, such that the distance D1 separating the two reflectors 8 and 9 is equal to substantially twice the distance $d_{Ak}$ that separates the thin anode 4 from the cathode 2.

BRIEF DESCRIPTION OF THE DRAWINGS

The invention according to an example embodiment will be well understood and its advantages will better appear on reading the following detailed description, given by way of indicative example that is in no way limiting, with reference to the accompanying drawings presented below.

FIG. 4 represents an example of an axial Vircator with five open reflectors of uniform radius, in longitudinal view, serving as a control for analysis of simulation results;

FIG. 5 represents an axial Vircator with five open reflectors according to an embodiment of the invention, in longitudinal view.

FIG. 6 presents a first table summarizing the control devices with N open reflectors of uniform radius, i.e. having all the same radius, used to compare simulation results;

FIG. 7 presents a second table summarizing the devices with N open reflectors of decreasing radius, according to example embodiments of the invention, with which simulations were carried out;

Figure 1:
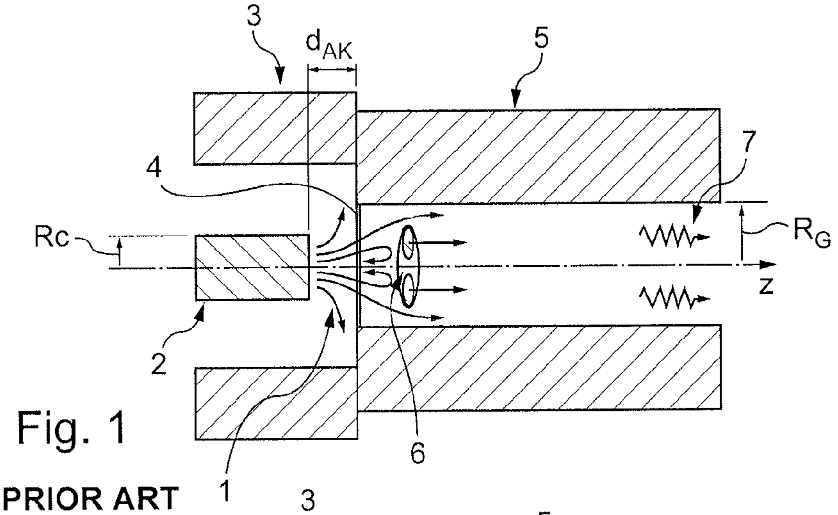
Fig. 1 PRIOR ART
FIG. 1 represents a conventional axial Vircator according to the prior art, in longitudinal view.
Figure 2:
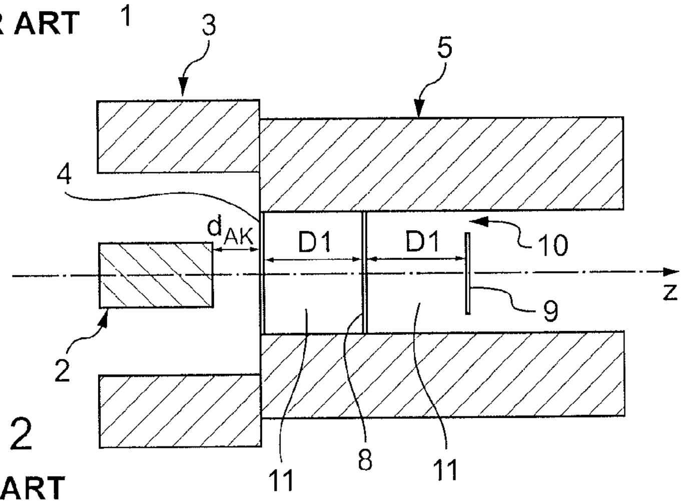
Fig. 2 PRIOR ART
FIG. 2 represents an axial Vircator with reflectors according to the prior art, in longitudinal view.
Figure 3:
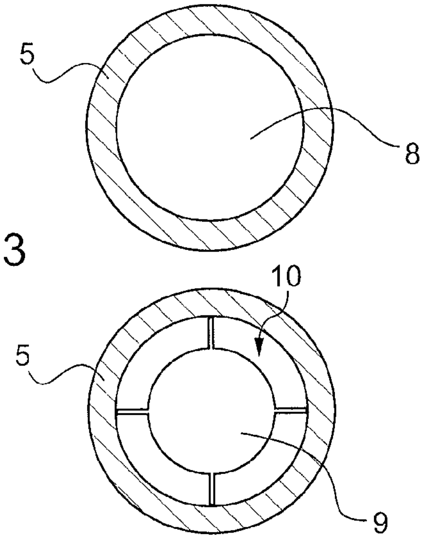
FIG. 3 represents a front view of a closed reflector and of an open reflector.

Identical components represented in FIGS. 1 to 9 are identified by identical numerical references.

DETAILED DESCRIPTION

A device according to an embodiment of the invention represented for example in FIG. 5 comprises a set of $N \geq 2$ open reflectors 9 located in a wave guide 5, formed from a material transparent to electrons and configured to reflect a microwave wave created by virtual cathodes, for example such as aluminized mylar.

All the reflectors 9 are "open" in order to facilitate the propagation of the wave emitted by the different virtual cathodes towards the exit of the wave guide 5.

The inside radius $R_{R1}$ of the first open reflector 9, located after the thin anode 4 in the wave guide 5, is preferably equal to or greater than 0.75 $R_G$. It thus reflects a maximum of the radial component of the electric field of the wave and strengthens the microwave wave emitted by the first virtual cathode.

The inside radius $R_{Ri}$ of the following (N−1) open reflectors 9 is progressively reduced, without lower limit. The size of the radius of each reflector is possibly chosen less than 0.75 $R_G$. The provisions for reducing the size of the radius of the open reflectors 9 are for example the following:

- The radius $R_{RN}$ of the first reflector 9 (that is to say of rank i=N) is less than the radius $R_{R1}$ of the first reflector 9 (that is to say of rank i=1);
- The radius $R_{R(i+1)}$ of the reflector 9 of rank (i+1) is less than or equal to the radius $R_{Ri}$ of the reflector 9 of rank (i), that is to say of the directly preceding reflector.

For example, the device comprises, between the first and the last open reflector 9, a plurality of open reflectors 9, such that a reflector of the plurality of rank (i+1) presents a radius $R_{R(i+1)}$ less than or equal to the radius $R_{Ri}$ of a reflector of the plurality of directly preceding rank (i). According to some embodiments, a reflector of the plurality of rank (i) presents a radius $R_{Ri}$ greater than the radius $R_{Rj}$ of a reflector of the plurality of rank (j>i). According to a particular example, the radius $R_{R(i+1)}$ of the reflector of the plurality of rank (i+1) is less than the radius $R_{Ri}$ of the reflector of the plurality of directly preceding rank (i), and the radius $R_{R(i+1)}$ of the reflector of the plurality of rank (i+1) is greater than the radius $R_{RN}$ of the last reflector 9 and the radius $R_{Ri}$ of the reflector of the plurality of rank (i) is less than the radius $R_{R1}$ of the first reflector 9, that is to say that all the N reflectors are then of strictly decreasing radius from the first to the last, for example according to an affine or exponential function.

On crossing the virtual cathode, the electron or electrons take energy from the microwave wave which propagates in the wave guide 5, the radius $R_{R(i+1)}$ of the reflector of rank (i+1) is reduced relative to the radius $R_{Ri}$ of the reflector of rank (i), in order to locate the electrons in the neighborhood of the axis z of the wave guide 5 preventing them from interacting with the microwave wave 7 in locations in which the latter has maximum amplitudes of electromagnetic fields. The average position of the virtual cathode formed beyond the reflector of rank (i+1) is thus away from the zone in which the amplitude of the wave is high.

The performance of such a device is increased relative to that of a conventional axial Vircator of the known prior art (i.e. without any reflector), and of an axial Vircator with reflectors of the known prior art.

EXEMPLARY EMBODIMENTS

The behavior of an axial Vircator comprising N open reflectors 9 according to an embodiment of the invention, as represented for example by FIG. 5 for N=5, has been simulated. The simulated configurations comprise 1 to 5 reflectors according to the case, that is to say N=1, . . . 5, and are summarized in the table of FIG. 7

To reveal the claimed properties, the performance of the device simulated according to an embodiment of the invention are compared with those of a conventional axial Vircator according to the known state of the art (as represented for example by FIG. 1, without reflector, i.e. pour N=0), and with those of a control device comprising N reflectors, all open and of uniform radius, according to the configurations summarized in the table of FIG. 6, and for example represented diagrammatically in FIG. 4 for N=5.

According to the simulated example embodiment of the present invention, the device is dimensioned such that the microwave electromagnetic radiation is generated at a frequency neighboring 3 GHz (gigahertz) for a voltage applied to the diode of 500 kV (kilovolts). The dimensioning is then the following:

$d_{Ak}$=23 mm, $R_c$=45 mm,

And the cylindrical wave guide 5 is of radius $R_G$=76 mm.

In the present example, the cylindrical wave guide 5 is furthermore of length 500 mm.

The device according to embodiments of the invention comprises N open reflectors 9 (N having a value between 1 and 5 according to the case simulated), which are situated in the cylindrical wave guide 5.

All the open reflectors 9 are placed at the same potential as the anode 3, 4 and the cylindrical wave guide 5.

As explained earlier, the first open reflector 9 is positioned such that the first virtual cathode is substantially at the center of the pseudo-cavity 11 formed by the thin anode 4, that first open reflector 9 and the wave guide 5. The longitudinal distance D1 which separates the first open reflector 9 from the thin anode 4 is of the order of twice the distance $d_{Ak}$ that separates the thin anode 4 from the cathode 2. Similarly the open reflector 9 of rank (i+1) is positioned such that the $(i+1)^{th}$ virtual cathode forms at the center of the pseudo-cavity formed by the open reflector 9 of rank (i), the open reflector 9 of rank (i+1) and the internal wall of the wave guide 5. The longitudinal distance which separates two successive reflectors ((i) and (i+1)) is substantially equal to the distance D1. As specified by FIG. 7, in the simulated devices, the distances D1 have the value for example 60 mm (FIG. 7 indicating the distances of each reflector relative to the thin anode 4), the inside radius $R_{R1}$ of the first reflector is greater than 0.75 $R_G$, and here has the value 60 mm (i.e. approximately 0.8 $R_G$), and the open reflectors 9 of rank (i>1) have a radius $R_{Ri}$ less than or equal to the radius $R_{R1}$ of the first reflector (the one of rank i=1), the last reflector having a radius $R_{RN}$ less than the radius $R_{R1}$ of the first reflector. In this case, the radius $R_{R2}$ of the second reflector 9 is equal to that of the first reflector (i.e. 60 mm), that is to say $R_{R2}=R_{R1}$=60 mm, the radius of the third reflector is reduced (relative to the preceding two) to 50 mm (i.e. approximately 0.66 $R_G$), the radius of the fourth reflector is maintained at 50 mm, and the radius of the fifth reflector is reduced to 40 mm, that is to say approximately 0.5 $R_G$. Thus, at least the last reflector has a radius less than 0.75 $R_G$, and in this case, the radius of a reflector is less than 0.75$R_G$ as of the third reflector. It is furthermore to be noted here that all the radii less than $R_{R1}$ are moreover less than 0.75$R_G$. In this example, the radii of the reflectors are equal in pairs, as far as possible since the device described here comprises five reflectors, and when a reduction occurs, the radii are reduced by a uniform step size of value 10 mm here. There is thus a step between the second and the third reflector, and between the fourth and the fifth reflector.

For comparison of the results, the control devices with N open reflectors and of uniform radius are detailed in the table of FIG. 6, which specifies the number, the positioning relative to the thin anode 4, and the radius of the reflectors present in the different embodiments considered. The reflectors 9 of the control devices are all open. Their positioning is identical to that of the device according to the invention. As regards the radius of each reflector, this is kept uniform, at 60 mm, i.e. all the open reflectors 9 of the control devices have identical radii.

Figure 8:
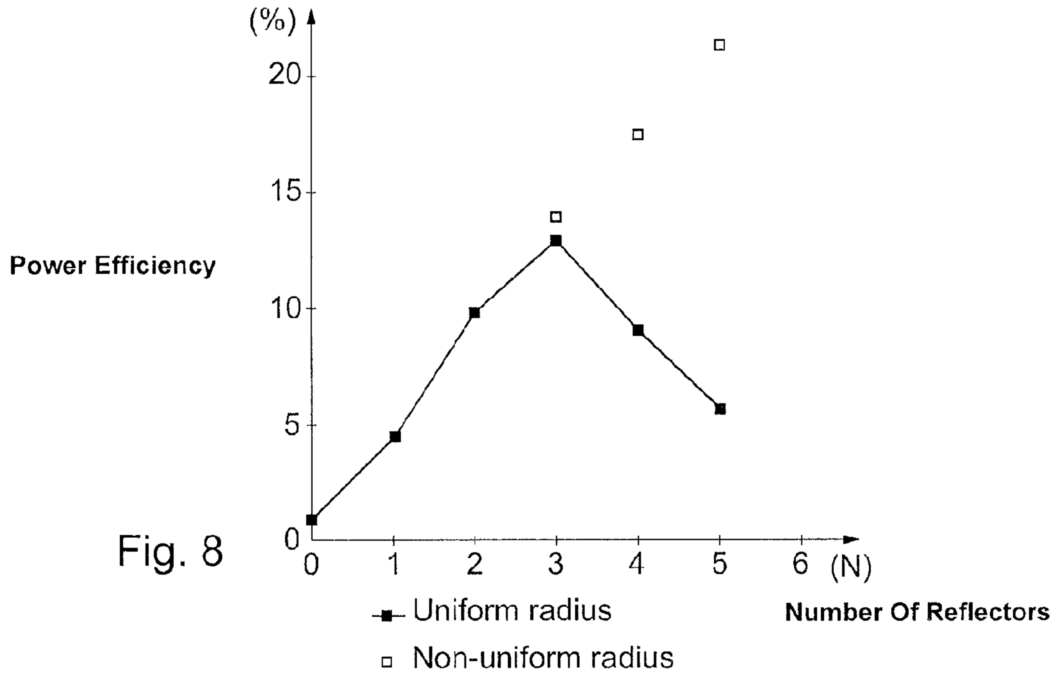
FIG. 8 illustrates change in power efficiency (%) according to the number of reflectors in the device, in the case of a device without a reflector (N=0) according to the known state of the art, of a control device with N open reflectors of uniform radius (here equal to 60 mm as presented in FIG. 6), and in the case of a device according to an embodiment of the invention (i.e. with at least three open reflectors of non-uniform radius, as presented in FIG. 7)

Further to simulations, as shown by FIG. 8, relative to a conventional Vircator without reflector (N=0) according to the known state of the art (as represented by FIG. 1), the device with 5 reflectors according to an embodiment of the invention (N=5, for example represented in FIG. 5) enables a microwave radiation of high power to be generated (at a frequency neighboring 3 GHz) with a power efficiency nearly 21 times higher, i.e. an efficiency of 21% approximately.

Figure 9:
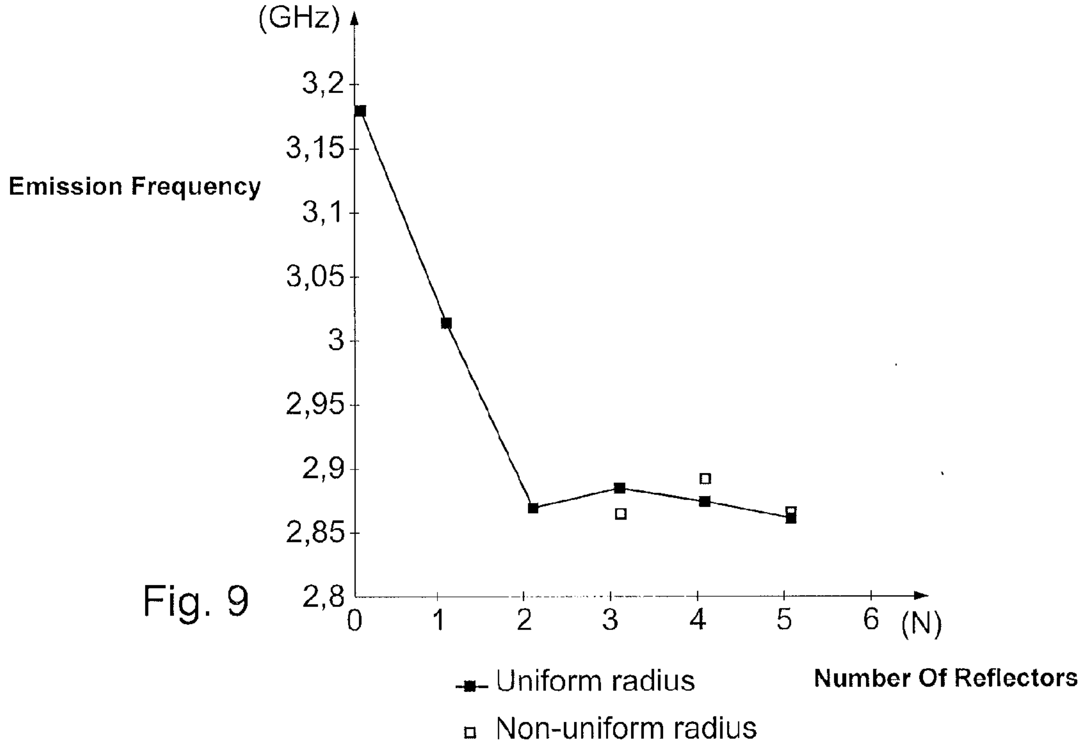
FIG. 9 illustrates change in the emission frequency of the microwave wave according to the number of reflectors in the device, in the case of a device without a reflector (N=0) according to the known state of the art, of a control device with N open reflectors of uniform radius (here equal to 60 mm as presented in FIG. 6), and in the case of a device according to an embodiment of the invention (i.e. with at least three open reflectors of non-uniform radius, as presented in FIG. 7).

And relative to a control device with N open reflectors 9 and of uniform radius (for example represented in FIG. 4 with N=5 reflectors), the device according to an embodiment of the invention makes it possible, by reducing the size of the reflectors, to improve the power efficiency for a number of reflectors greater than or equal to 3 (N≥3), while maintaining the emission frequency (this last point being illustrated in FIG. 9). To be precise, FIG. 8 shows that the optimum efficiency of a device according to an embodiment of the invention with five reflectors (N=5) is approximately 1.6 times higher than the optimum efficiency of the control devices, that is to say that an axial Vircator comprising N=3 open reflectors of uniform radius.

Naturally, the present invention is not limited to the preceding description, but extends to any variant within the scope of the following claims.

The invention claimed is:

1. A microwave wave generator device with a virtual cathode oscillator, in axial configuration, the device comprising:

a cathode; and a thin anode positioned at an entrance to a cylindrical wave guide having a radius ($R_G$), the thin anode between the cathode and the wave guide, the device further comprising:

at least a first open reflector and a last open reflector located in the wave guide, and transparent to electrons and configured to reflect a microwave wave created by at least one virtual cathode generated in the wave guide, wherein the first open reflector is a closest reflector to the thin anode, and the last open reflector is a closest reflector to an exit from the wave guide;

a plurality of open reflectors including the first and the last open reflector such that a designated reflector of the plurality of open reflectors has a radius ($R_{R(i+1)}$) less than or equal to a radius ($R_{Ri}$) of a directly preceding reflector of the plurality of open reflectors, where (i) is a reflector rank, and the last open reflector has a radius ($R_{RN}$) less than a radius ($R_{R1}$) of the first open reflector, where (N) is the total number of reflectors.

2. A device according to claim 1, wherein the designated reflector of the plurality of open reflectors of rank (i) presents a radius ($R_{Ri}$) greater than the radius ($R_{Rj}$) of a reflector of the plurality of open reflectors of rank (j>i), where (j) is a reflector rank different from (i).

3. A device according to claim 1, wherein the radius $R_{R(i+1)}$ of the designated reflector of the plurality of open reflectors of rank (i+1) is less than the radius $R_{Ri}$ of a second designated reflector of the plurality of open reflectors of directly preceding rank (i), and the radius $R_{R(i+1)}$ of the designated reflector of the plurality of open reflectors of rank (i+1) is greater than the radius $R_{RN}$ of the last reflector and the radius $R_{Ri}$ of the second designated reflector of the plurality of open reflectors of rank (i) is less than the radius $R_{R1}$ of the first reflector.

4. A device according to claim 1, wherein the radius $R_{R1}$ of the first open reflector is equal to or greater than 0.75 $R_G$.

5. A device according to claim 1, wherein at least the radius $R_{RN}$ of the last reflector is less than 0.75 $R_G$.

6. A device according to claim 1, wherein the radius $R_{RN}$ of the last reflector is less than 0.5 $R_G$.

7. A device according to claim 1, wherein the radius $R_{R2}$ of a second reflector is less than 0.5 $R_G$.

8. A device according to claim 1, wherein the plurality of open reflectors comprises at least three open reflectors.

9. A device according to claim 1, wherein at least one open reflector comprises aluminized mylar.

* * * * *